(12) United States Patent
Chen

(10) Patent No.: US 6,690,171 B2
(45) Date of Patent: Feb. 10, 2004

(54) BATTERY CAPACITY DETECTION DEVICE AND METHOD

(75) Inventor: Chih-Ching Chen, Taipei Hsien (TW)

(73) Assignee: Chicony Electronics Co., Ltd., Taipei Hsien (TW)

( * ) Notice: Subject to any disclaimer, the term of this patent is extended or adjusted under 35 U.S.C. 154(b) by 0 days.

(21) Appl. No.: 10/087,812

(22) Filed: Mar. 5, 2002

(65) Prior Publication Data

US 2003/0169047 A1 Sep. 11, 2003

(51) Int. Cl.[7] .......................... G01N 27/42; G01N 27/02
(52) U.S. Cl. ...................... 324/425; 324/444; 324/433; 340/636.2; 340/636.15
(58) Field of Search .................... 340/636.2, 636.15, 340/636.1; 324/425, 444, 426, 427, 433, 439; 320/136, 137, 134, 149; 702/63

(56) References Cited

U.S. PATENT DOCUMENTS 4,409,495 A * 10/1983 Enomoto et al. ........... 327/205
5,349,282 A * 9/1994 McClure ..................... 320/136

* cited by examiner

Primary Examiner—N. Le
Assistant Examiner—Vincent Q. Nguyen
(74) Attorney, Agent, or Firm—Bacon & Thomas, PLLC

(57) ABSTRACT

A battery capacity detection device and the method for the same are disclosed. The charge time for the capacitor in an RC circuit and a lookup table are employed to determine the charge capacity of the battery. The disclosed device uses a microprocessor with a programmable pin to form a discharge loop that controls the RC circuit. Therefore, the microprocessor can measure the current charge capacity of the battery after each time the capacitor discharges by measuring the time needed for the capacitor to get fully charged.

14 Claims, 3 Drawing Sheets

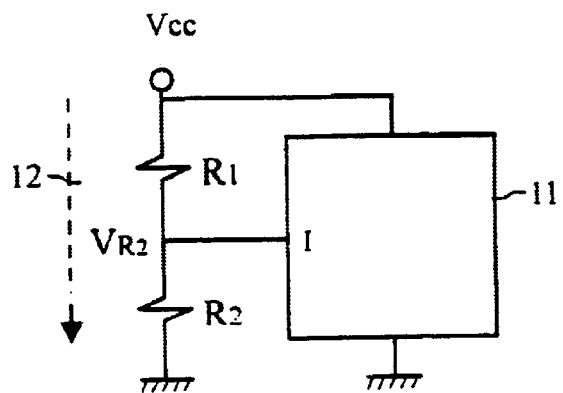
Fig. 1
(Prior Art)
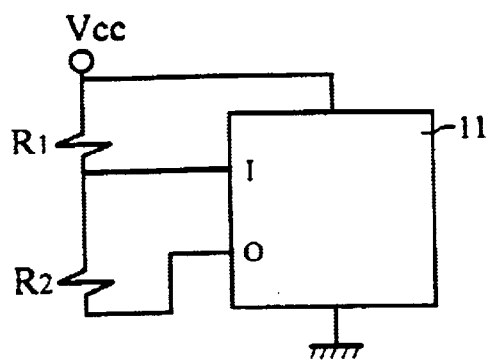 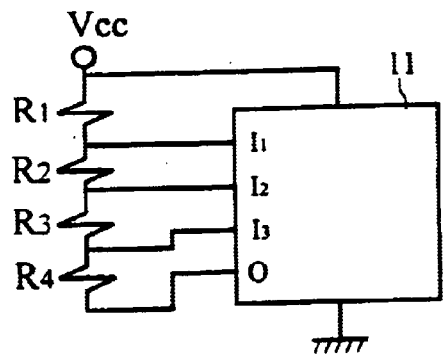
Fig. 2A　　　　　　　　Fig. 2B
(Prior Art)　　　　　　　(Prior Art)

BATTERY CAPACITY DETECTION DEVICE AND METHOD

BACKGROUND OF THE INVENTION

1. Field of Invention

The invention relates to a charge detection device and method and, in particular, to a charge detection device and method for measuring the charge capacity of a battery.

2. Related Art

The measurement of voltage output from a battery in the prior art mostly utilizes a voltage divider. The voltage at a detecting point is sent to a microprocessor for comparison to detect the charge capacity of the battery. As shown in FIG. 1, the voltage $V_{cc}$ of the battery provides the work power for the microprocessor 11. The voltage $VR_2$ is extracted from the voltage divider through resistor $R_2$. When the voltage of the battery drops, the voltage $VR_2$ also decreases. The input detection pin I of the microprocessor 11 is mainly used to receive the voltage $VR_2$. When the voltage $VR_2$ received by the detection pin is lower than a lower threshold voltage in the microprocessor 11, i.e. when the detection pin changes from a logic H to a logic L, then the charge capacity of the battery is insufficient. Although the above-mentioned method can easily measure the charge capacity of the battery, such a detection circuit using partial resistors may result in a leaking current 12, wasting the energy of the battery.

With reference to FIGS. 2A and 2B, since the detection circuit in FIG. 1 results in a leaking current, another method was proposed to connect the ground terminal GND of the resistor $R_2$ to the output pin O of the microprocessor 11. The detection device uses a program to set the initial value of the output pin O of the microprocessor 11 as a logic high H (with a potential $V_{cc}$), so that no leaking current occurs to the resistor circuit. When the microprocessor 11 measures the charge capacity of a battery, the output pin O of the microprocessor 11 switches from a logic high H to the logic low L (i.e. GND). The input terminal I of the microprocessor uses the above-mentioned partial voltage principle to measure the charge capacity of the battery. After the measurement is done, the output pin O is returned to the logic high H. As shown in FIG. 2B, the battery capacity detection device has the function of sectional charge measurements. The microprocessor 11 uses several input terminal pins $I_1$, $I_2$ and $I_3$ to measure the partial voltages to measure the charge capacity during the drop of the voltage output of the battery.

Although the charge detection device shown in FIGS. 2A and 2B can effectively avoid the occurrence of leaking currents, the microprocessor 11 employed has more pins. Therefore, even though the microprocessor 11 can use more resources to measure the capacity of the battery, the function of the microprocessor 11 often cannot be fully utilized.

A primary objective of the invention is to provide a battery capacity detection device and method to measure the work voltage and charge using the RC charging time and a look-up table.

Another objective of the invention is to provide a battery capacity detection device. Using the combination of an RC circuit and a microprocessor, only a single pin of the microprocessor is needed to detect the battery charge capacity in a continuous way.

SUMMARY OF THE INVENTION

In view of the problems of leaking currents and more microprocessor I/O pins in the conventional battery capacity detection device, the invention proposes a battery charge detection method. The battery charges an RC-loop and the charging time reflects the charge of the battery. The method includes the steps of: forming a discharge loop for the capacitor of the RC-loop until the capacitor discharges down to level 0; and measuring the time needed for the battery to charge the RC-loop until the capacitor is charged to a designated level so that the current charge capacity of the battery can be computed.

In accordance with a battery capacity detection device disclosed herein, it includes an RC-loop consisting of a battery, a resistor R and a capacitor C; and a microprocessor; wherein the microprocessor utilizes a work-mode programmable pin to measure the capacitor C in the RC-loop. When the microprocessor measures the charge of the battery, the programmable pin of the microprocessor is in the output mode, outputting a low level to form a discharge loop until the capacitor discharges to level 0. Afterwards, the programmable pin is set to the input mode to measure the time needed for the pin to transit from the low level to a high level. This is the charge time for the capacitor in the RC-loop to be charged from level 0 to the high level. The charge capacity of the battery is then computed from the charge time.

According to a preferred embodiment of the invention, the battery capacity detection method needs an RC-loop consisting of a battery, a resistor R and a capacitor C and a microprocessor with a programmable pin. The method includes the steps of: turning the microprocessor pin from an input mode to an output mode; having the programmable pin output a low level so that the capacitor in the RC-loop discharges to level 0; turning the microprocessor pin from the output mode to the input mode; and computing by the microprocessor the time needed for the pin to make the transition from the low level to a high level. The charging time needed for the pin to make the transition from the low level to a high level is used to compute the charge capacity of the battery.

BRIEF DESCRIPTION OF THE DRAWINGS

The present invention will become more fully understood from the detailed description given herein below by way of illustration only and thus is not limitative of the present invention, and wherein:

FIG. 1 is a conventional battery charge capacity detection circuit;

FIGS. 2A and 2B show another embodiment of the conventional battery charge capacity detection circuit;

DETAILED DESCRIPTION OF THE INVENTION

The disclosed method uses a battery to charge an RC-loop. The charge time reflects the charge capacity of the battery. The method includes at least the steps of: forming a discharge loop for the capacitor in the RC-loop until the capacitor discharges to level 0; and measuring the time needed for the battery to charge the capacitor in the RC-loop to a designated level, thereby allowing the current charge capacity to be computed.

The capacitor has the ability to charge and discharge. The charge time varies with the charge voltage. When the battery is connected to the RC circuit, the battery charges the capacitor in the RC circuit. The charge capacity of the capacitor increases from level 0 or a low level to saturation. The DC analysis of the RC circuit is open and does not have leaking currents. The disclosed method uses the charge time for the charge voltage to charge the capacitor along with a look-up table to obtain the charge capacity of the battery. The look-up table lists different charge times and the corresponding charge capacities of the capacitor in the RC circuit.

The discharge loop of the capacitor can be obtained by installing a ground switch at a terminal of the capacitor. The ON and OFF of the ground switch can select to release the charge of the capacitor, reducing the charge from saturation to level 0. The discharge action is prepared for computing the charge time of the capacitor. The capacitor is charged from the ground level to obtain a precise charge capacity detection, instead of some low level. Once the capacitor finishes discharging, the battery starts to charge the capacitor in the RC circuit and the charge time is measured until the charge capacity of the capacitor reaches a predetermined level. After the timer stops measuring the time, the charge time is checked with a look-up table to obtain the corresponding charge capacity of the battery at the moment.

Figure 4:
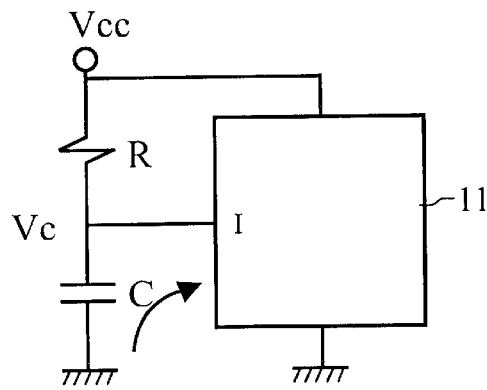
FIG. 4 is a structural diagram of the disclosed battery charge capacity detector.

The invention, according to the above-mentioned method, provides a battery capacity detection device. With reference to FIG. 4, the detection device in this embodiment contains a resistor R, a capacitor C and a microprocessor 11. The connection among them is shown in the drawing. The voltage $V_{cc}$ of the battery provides the work power for the microprocessor 11 to charge the capacitor in the RC circuit. When the microprocessor 11 obtains the work power, its internal utilities follow the program design to perform assigned jobs. The microprocessor 11 sets the state of the detection pin.

To avoid the occurrence of leaking currents when measuring the battery charge capacity and the associated problem of extra battery power consumption, the invention utilizes the DC charge and discharge principle that when the capacitor is charged to full by a DC current, the capacitor is open and no leaking current occurs in the RC circuit. Since the input-mode pin of the microprocessor 11 has high input impedance, it can be viewed as in an open state of a ground switch.

After the capacitor finishes charging, the voltage $V_c$ of the capacitor is almost equal to the voltage $V_{cc}$. The voltage of the capacitor represents a high level at the detection pin of the microprocessor 11. When the microprocessor 11 measures the charge capacity of the battery, a utility changes the detection pin of the microprocessor 11 from an input state to an output state. When the detection pin is in the output state, the detection pin has low impedance and can be viewed as the closed state of a ground switch. The voltage $V_c$ of the capacitor is released through the detection pin of the microprocessor 11. The purpose of the discharging is to ensure that the capacitor is always charged from level 0. The discharge time of the capacitor refers to the time needed for the voltage $V_c$ to continuously discharge from saturation to empty. Once the voltage $V_c$ of the capacitor becomes level 0 to the detection pin, the utility in the microprocessor 11 immediately converts the detection pin from the output state to the input state.

With further reference to FIG. 4, after the detection pin of the microprocessor 11 finishes its state transition, the detection pin is in the input state. Since the discharge end of the capacitor is closed, the voltage $V_{cc}$ recharges the capacitor through the RC circuit. Afterwards, the microprocessor 11 starts a timer to measure the charge time of the capacitor. The charge time is computed by using the detection pin of the microprocessor 11 to measure the level of the voltage $V_c$ of the capacitor. After the detection pin changes from the low level to the high level, one can know the charge time of the battery on the capacitor. The microprocessor 11 then uses this charge time along with a built-in charge capacity table to find out the capacity of the battery. Since the battery capacity detection device uses the microprocessor 11 to detect the state transition of the detection pin, only one detection pin is needed to achieve the job of continuous battery charge capacity detection.

Figure 5:
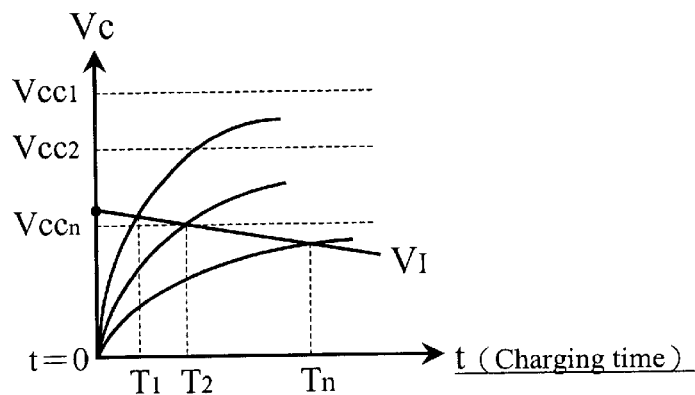
FIG. 5 shows characteristic curves in the lookup table of the disclosed application program.

As shown in FIG. 5, batteries of different types or made of different materials have distinct discharge characteristics. Therefore, the lookup table built in the application program requires the experimental data from all types of batteries. However, the voltage of the battery $V_{cc}$ will gradually drop after many times of uses. When the voltage $V_{cc}$ decreases, the work power of the microprocessor 11 also drops. The high level of the detection pin of the microprocessor 11 also lowers with the work power of the microprocessor 11, changing the high level voltage of the detection pin.

With further reference to FIG. 5, the characteristic curves for capacitors are drawn in a Cartesian coordinate system, where the vertical coordinate is the voltage $V_c$ of the capacitor and the horizontal coordinate is the charge time t of the capacitor. When the capacitor charges from the zero level, the timer inside the microprocessor 11 starts and measures the charge time of the capacitor. As the high level of the detection pin of the microprocessor 11 varies with the voltage $V_{cc}$, the lookup table is used to find out the threshold voltage VI for the detection pin to change from the low level to the high level for different curves under the voltages $V_{cc1}$, $V_{cc2}, \ldots, V_{ccn}$. In this way, the microprocessor 11 can figure out the time $T_1, T_2, \ldots, T_n$ needed for the detection pin to make the level transition when the battery charges the capacitor under different voltages.

Each time the charge voltage $V_c$ of the capacitor reaches the threshold voltage $V_1$, the level at the detection pin of the microprocessor 11 changes from the low level to the high level. The timer of the microprocessor 11 also records the charge time and checks it with the lookup table. In this way, the microprocessor 11 can determine the charge left in the battery and display it.

Figure 6:
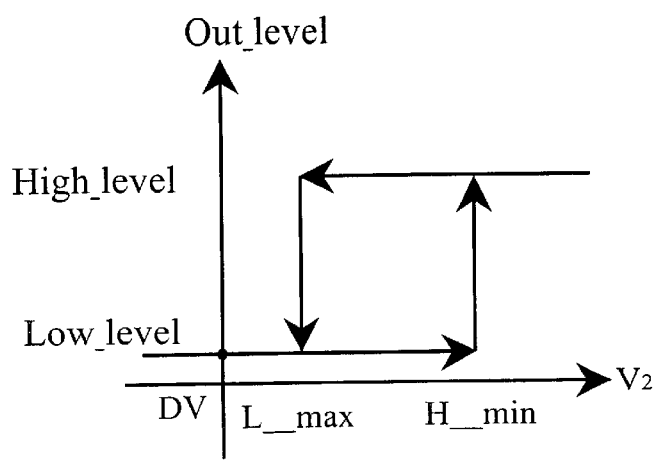
FIG. 6 shows the characteristic curve of the Schmidt trigger circuit.

In the preferred embodiment of the invention, the detection pin of the microprocessor 11 measures the voltage $V_c$ of the capacitor to determine the level. In practice, the determination of the level by the detection pin actually has a gray area. When the voltage $V_c$ falls within the gray area, the microprocessor 11 cannot determine whether it is at a high or low level. To solve this problem, the invention utilizes the Schmitt trigger to set the high and low level ranges. The Schmitt trigger has a delay comparator, which uses a positive feedback method to increase the gain of the comparator. Its conversion character is shown in FIG. 6. In the drawing, $H_{min}$ is the upper threshold or upper trigger and $L_{max}$ is the lower threshold or lower trigger.

With further reference to FIG. 6, when the detection pin of the microprocessor 11 finds that the voltage $V_c$ of the capacitor increases to the upper or lower threshold of the Schmitt trigger, the level determination is in accordance with the previous level. If the previous level is a low level, then the detection pin remains the low level determination. When the capacitor is continuously charged so that the voltage $V_c$ is over $H_{min}$, the detection pin confirms the transition from the low level to the high level.

According to the preferred embodiment of the invention, the battery charge detection method needs an RC-loop composed of a battery, a resistor R and a capacitor C, and a microprocessor with a programmable pin. The method includes the following steps.

The microprocessor pin changes from an input mode to an output mode. The pin in the output mode is programmed to output a low level voltage, so that the capacitor in the RC-loop discharges through the pin to the zero level. The microprocessor pin is then changed from the output mode to the input mode. The microprocessor starts to measure the time needed for the pin to make a transition from the low level to the high level, i.e. the time for the capacitor in the RC-loop to be charged from the zero level to the high level, thus giving the charge capacity of the battery.

Figure 3:
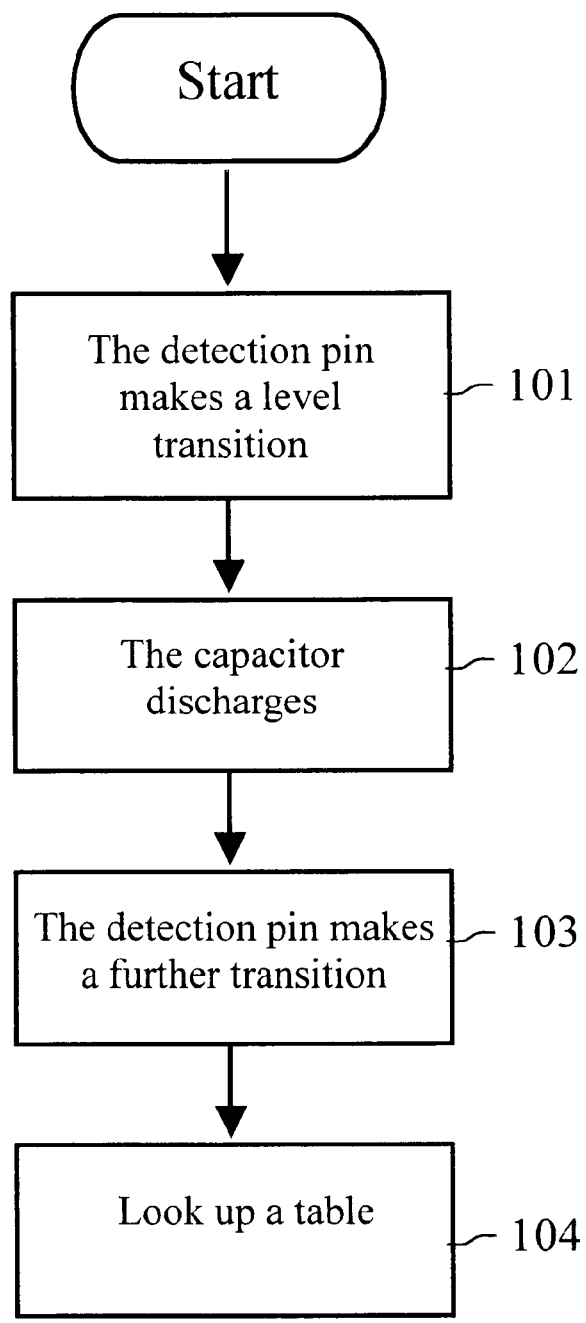
FIG. 3 is a flowchart of the disclosed battery capacity detection device.

Allow us to explain the method in more detail. With reference to FIG. 3, the battery capacity detection method requires a battery to provide a voltage $V_{cc}$, a resistor R and a capacitor C to form an RC-loop, and a microprocessor with a programmable pin. The pin is connected to the charge terminal of the capacitor C to form a discharge loop. As described above, the method includes the following steps:

(1) The detection pin makes a level transition 101:

The battery provides a DC voltage $V_{cc}$ as the work and charge power source for the microprocessor. After the microprocessor starts working, its application program first sets the state of the detection of the microprocessor. At this moment, the detection pin is set in the input mode (I/P) and the battery charges the capacitor to saturation. When the microprocessor measures the charge capacity of the battery, the detection pin changes from the input mode to the output mode (O/P) through the setting of the application program.

(2) The capacitor discharges 102:

After the detection pin of the microprocessor changes to the output mode, the detection pin output is set at the low level. The detection pin of the microprocessor and the capacitor form a discharge loop. The capacitor uses the detection pin to discharge until its terminal voltage drops to zero. The purpose of the discharge is to ensure that the capacitor can be charged from the zero level every time.

(3) The detection pin makes a further transition 103:

Once the capacitor discharges through the detection pin down to the zero level, the detection pin is changed from the output mode to the input mode by the application program of the microprocessor. The detection pin has large impedance in the input mode. Therefore, the capacitor begins to charge and the microprocessor starts its timer to measure the time until the detection pin determines the level is changed to the high one. The time thus measured is the time for the capacitor to charge from the zero level to the high level.

(4) Look up a table 104:

The time measured and recorded by the timer is checked with a charge lookup table to obtain the charge capacity of the battery. The table contains experimentally established data. In practice, the time for the detection pin of the microprocessor to reach the transition level $V_1$ and the charge time of the capacitor differ each time, depending upon the battery voltage $V_{cc}$. This is why one needs to do experiments in advance to establish the charge capacity lookup table.

EFFECTS OF THE INVENTION

There are many advantages in the disclosed battery capacity detection device and method. The method can be applied to all types of battery charge capacity detection. With the help of the RC circuit and the lookup table, the method can compute the charge capacity of the battery.

An advantage of the disclosed battery capacity detection device is that an RC circuit is used to avoid leaking currents and thus possible damage to the battery. At the same time, through the state transition of the detection pin, only a single pin is needed to detect the charge capacity of the battery, effectively reducing the uses of other pins on the microprocessor.

While the invention has been described by way of example and in terms of the preferred embodiment, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A battery capacity detection method, which utilizes a microprocessor with a pin to form a discharge circuit for a capacitor C in an RC circuit, the RC circuit and a battery forming a charge circuit, comprising the steps of:

a) setting the pin in an output mode by the microprocessor so that the capacitor C releases its charge in the discharge circuit until it reaches the zero level;

b) setting the pin from the output mode to the input mode by the microprocessor and starting to measure the charging time until the voltage of the capacitor C reaches a predetermined level; and c) obtaining the charge capacity of the battery according to the charging time by the microprocsssor.

wherein the microprocessor contains a lookup table which records the times for batteries in different charge capacities to charge the capacitor C in the RC circuit from the zero level to the predetermined level.

2. The method of claim 1, wherein the pin of the microprocessor is set in the input mode before the detection.

3. The method of claim 1, wherein the charging time is the time for the battery to charge the capacitor C in the RC circuit from the zero level to the predetermined level.

4. The method of claim 1, wherein the microprocessor figures out the charge capacity of the battery corresponding to the measured charge time from the lookup table.

5. The method of claim 1, wherein the pin outputs a low level voltage when it is set in the output mode.

6. The method of claim 5, wherein the predetermined level is the level that triggers the output of the Schmitt trigger to go from the low level to the high level.

7. The method of claim 1, wherein the pin has a Schmitt trigger when the pin is set in the input mode.

8. A battery capacity detection method, which utilizes a microprocessor with a pin having an I/O setting mode to form a discharge circuit for a capacitor C in an RC circuit, the RC circuit and a battery forming a charge circuit, comprising the steps of:

a) setting the pin in an output mode by the microprocessor so that the capacitor C releases its charge in the discharge circuit until it reaches the zero level;

b) setting the pin from the output mode to the input mode by the microprocessor and starting to measure the time until the voltage of the capacitor C reaches a predetermined level; and c) obtaining the charge capacity of the battery according to the measured time by the microprocessor.

wherein the microprocessor contains a lookup table which records the times for batteries in different charge capacities to charge the capacitor C in the RC circuit from the zero level until the pin changes from the low level to the high level.

9. The method of claim 8, wherein the pin has a Schmitt trigger in the input mode.

10. The method of claim 8, wherein the time is the charge time for the battery to charge the capacitor C in the RC circuit from the zero level to the predetermined level.

11. The method of claim 8, wherein the microprocessor figures out the charge capacity of the battery corresponding to the measured charge time from the lookup table.

12. A battery capacity detection device, which comprises:

a battery;

an RC circuit, which forms a charge circuit with the battery; and a microprocessor, which has a programmable pin having an I/O setting mode to form a discharge circuit for the capacitor in the RC circuit;

wherein when the microprocessor detects the battery charge capacity, the pin is set in the output mode for the capacitor C to release its charge until reaching the zero level, then the pin is switched to the input mode and the microprocessor measures the time needed for the pin to made a transition from the low level to the high level, thus finding out the large capacity of the battery.

wherein the microprocessor contains a lookup table which records the times for batteries in different charge capacities to charge the capacitor C in the RC circuit from the zero level until the pin changes from the low level to the high level.

13. The device of claim 12, wherein the pin has a Schmitt trigger in the input mode.

14. The device of claim 12, wherein the microprocessor figures out the charge capacity of the battery corresponding to the measured charge time from the lookup table.

* * * * *